United States Patent
Runge et al.

(10) Patent No.: US 7,859,278 B2
(45) Date of Patent: Dec. 28, 2010

(54) PROBE HOLDER FOR A PROBE FOR TESTING SEMICONDUCTOR COMPONENTS

(75) Inventors: Dietmar Runge, Grosserkmannsdorf (DE); Stojan Kanev, Sacka (DE); Claus Dietrich, Thiendorf (DE)

(73) Assignee: SUSS MicroTec Test Systems GmbH (DE)

( * ) Notice: Subject to any disclaimer, the term of this patent is extended or adjusted under 35 U.S.C. 154(b) by 0 days.

(21) Appl. No.: 11/674,205

(22) Filed: Feb. 13, 2007

(65) Prior Publication Data

US 2008/0122465 A1 May 29, 2008

(30) Foreign Application Priority Data

Nov. 29, 2006 (DE) .................. 10 2006 056 543

(51) Int. Cl.
*G01R 1/04* (2006.01)

(52) U.S. Cl. ...................... 324/754; 324/761

(58) Field of Classification Search ................... 324/762
See application file for complete search history.

(56) References Cited

U.S. PATENT DOCUMENTS

| | | | | |
|---|---|---|---|---|
| 3,648,169 A | * | 3/1972 | Wiesler | ...................... 324/762 |
| 3,781,681 A | * | 12/1973 | Wagner et al. | ............... 324/762 |
| 3,851,249 A | * | 11/1974 | Roch | ........................... 400/320 |
| 3,939,414 A | * | 2/1976 | Roch | ........................... 324/758 |
| 4,001,685 A | * | 1/1977 | Roch | ........................... 324/762 |
| 4,034,293 A | * | 7/1977 | Roch | ........................... 324/762 |
| 4,056,777 A | * | 11/1977 | Roch | ........................... 324/762 |
| 4,251,772 A | * | 2/1981 | Worsham et al. | ............. 324/765 |
| 5,012,186 A | * | 4/1991 | Gleason | ...................... 324/762 |
| 5,489,855 A | * | 2/1996 | Poisel | ......................... 324/762 |
| 6,127,832 A | * | 10/2000 | Comulada, Jr. et al. | ..... 324/754 |
| 6,489,795 B1 | * | 12/2002 | Klele et al. | .................. 324/762 |
| 7,250,782 B2 | * | 7/2007 | Romanov et al. | ............ 324/756 |
| 7,579,849 B2 | * | 8/2009 | Kiesewetter et al. | ........ 324/754 |

* cited by examiner

*Primary Examiner*—Vinh P Nguyen
(74) *Attorney, Agent, or Firm*—Heslin Rothenberg Farley & Mesiti P.C.

(57) ABSTRACT

A probe holder in which the probe needle has a slight horizontal offset under the action of a vertical force comprises a probe holder for a probe needle, wherein the holder is adapted, for fastening and electrical contact-connection, on a carrier device of a test apparatus and has a holder arm having a needle holder at the free end thereof to fasten the probe needle, and a fastening arm for connecting the holder arm to the carrier device. The holder arm and fastening arm are connected to one another by a parallel guide whereby horizontal offset of the needle tip on account of external forces can be reduced or even prevented making it easier for the probe needle to carry out a vertical yielding movement, with almost no rotation of the probe needle about a horizontal axis.

15 Claims, 1 Drawing Sheet

PROBE HOLDER FOR A PROBE FOR TESTING SEMICONDUCTOR COMPONENTS

BACKGROUND ART

Figure 1A:
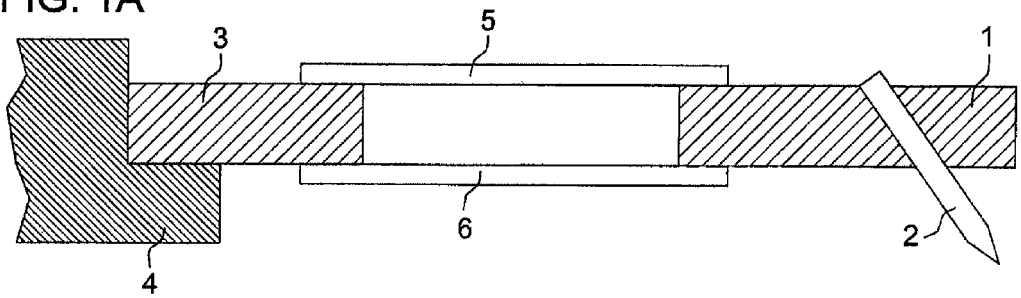

The invention relates to a probe holder for a probe.

In order to test the functionality of semiconductor components, the semiconductor components, which are usually still combined with other semiconductor components and are arranged on a wafer at this point in time, are placed and fastened in a test apparatus, which is provided for this purpose, on a movable test table (chuck). The semiconductor component is then contact-connected using a probe so that measurements can be carried out. The probe, which is in the form of a needle and is also referred to as a probe tip, is usually fastened to a carrier device, for example a carrier plate (probe card) or a probe holder arm (probe arm), in such a manner that it is arranged obliquely with respect to the surface of the semiconductor component. That part which connects the probe needle to the carrier device is uniformly referred to below as a probe holder. The present invention relates to an improved probe holder of this type.

In order to establish electrical contact between the probe needle and the semiconductor component to be tested (device under test, DUT), the probe needle is positioned above the semiconductor component and is brought into contact with a contact area, for example a bonding island of the semiconductor component, by lowering the probe holder. The force which acts on the probe needle in the vertical direction in this case results in deformation of the probe holder or/and of the probe needle or, if the probe needle is not rigidly clamped in, in rotation of the probe needle about a horizontal axis. The resulting displacement of the tip of the probe needle in the horizontal direction (horizontal offset) results in inaccuracies, which are difficult to control, when positioning the probe needle during the test and measurement operations.

On the basis of this prior art, the object of the present invention is to specify a probe holder which overcomes the disadvantages of the prior art and in which, in particular, the probe needle has a smaller horizontal offset under the action of a vertical force.

SUMMARY OF THE INVENTION

The inventive probe holder for a probe needle, which, for fastening and electrical contact-connection, is formed on a carrier device of a test apparatus and has a holder arm having a needle holder which is arranged at the free end of the holder arm and is intended to fasten the probe needle, is distinguished by the fact that provision is also made of a fastening arm for connecting the probe holder to the carrier device, and by the fact that the holder arm and the fastening arm are connected to one another by means of a parallel guide.

The basic concept of the invention is based on the consideration that the horizontal offset of the needle tip on account of external forces can be reduced or even prevented making it easier for the probe needle to carry out a vertical yielding movement, which requires almost no rotation of the probe needle about a horizontal axis—whether on the basis of rotation of the probe needle relative to the holder arm or on the basis of flexural deformation of the holder arm. According to the invention, this is achieved by virtue of the fact that the holder arm which carries the probe needle is mounted in a parallel guide. This parallel guide likewise itself requires a mount which is provided by the fastening arm. At its free end, that is to say that end which is opposite the needle holder, the fastening arm itself is designed to be connected and contact-connected to the carrier device of a test apparatus. When installed inside a test apparatus for testing semiconductor components, the probe holder will usually be arranged horizontally or obliquely above the semiconductor component which is to be tested and is usually arranged horizontally. Insofar as the terms "horizontal" and "vertical" are used below, they relate to the normal installation of the probe holder in a test apparatus of the type just described.

In the sense of this application, a parallel guide is intended to be understood as meaning a guide means which can be fitted between the holder arm and the fastening arm and, when an external vertical force acts on the tip of the probe needle, gives rise to a parallel displacement of the holder arm in the direction of the vertical force, that is to say a purely translatory movement of the holder arm and of the probe needle, which is fitted to the latter, without a rotary component. Parallel guides of this type may be configured in various ways without departing from the basic concept of the invention. For example, the parallel guide could be designed in such a manner that the holder arm has at least one slide element that is mounted such that it can be displaced in a vertical slide rail that is provided on the fastening arm. However, on account of the small dimensions of the parts of the probe holder, such a solution would presumably be relatively complicated to produce and would therefore be costly. Some advantageous refinements of the concept of the invention are explained below.

In one refinement of the invention, the parallel guide comprises at least two connecting elements which are arranged parallel to one another and at a distance from one another, are of the same length and are each connected, at one of their ends, to the holder arm and, at their other end, to the fastening arm. The two parallel connecting elements which are of the same length and may be in the form of bars, for example, force the holder arm to be displaced in a parallel manner, during which the holder arm is not rotated about a horizontal axis. This refinement is advantageous because it has a simple construction and is inexpensive to produce.

Provision may be made for at least one connecting element to be mounted in an articulated manner at least on one side or/and for at least one connecting element to be rigidly mounted at least on one side. This results in a multiplicity of possible combinations for mounting the at least two connecting elements. For example, for embodiments in which the parallel guide comprises two connecting elements, provision may be made for both connecting elements to be rigidly mounted on both sides, for instance, as shown in FIG. 1A.

Figure 1B:
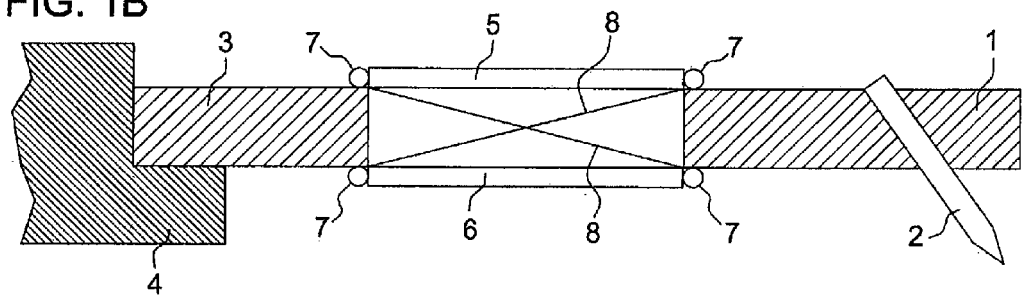
Figure 1C:
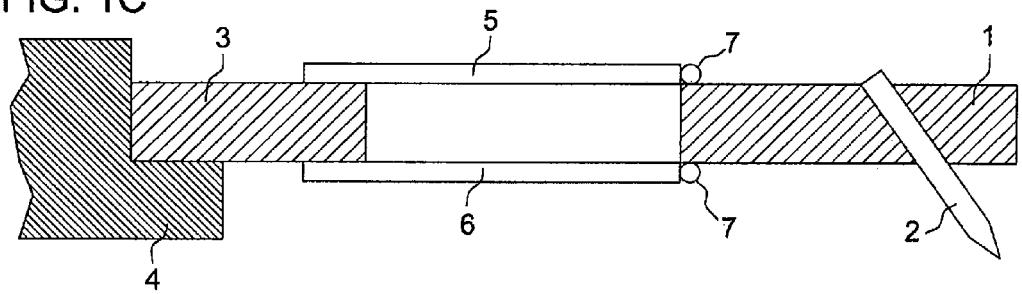
Figure 1D:
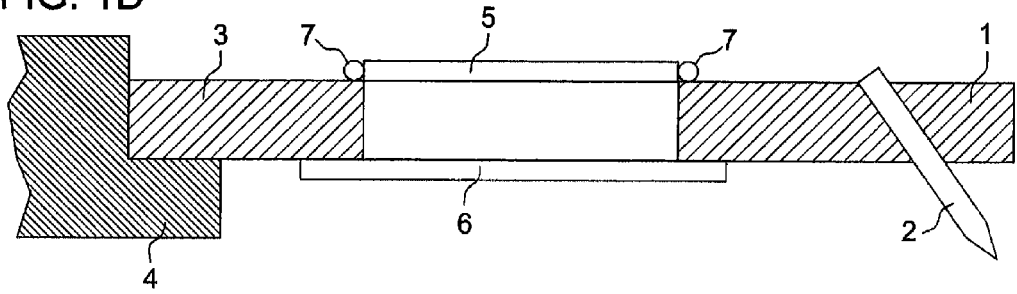

Alternatively, for such embodiments, provision may be made for both connecting elements to be rigidly mounted on one side and to be mounted in an articulated manner on one side, for instance, as shown in FIG. 1C, in which case the rigid mounting and the articulated mounting of the two connecting elements can be respectively effected either at the same end or at opposite ends. It is likewise possible for one connecting element to be rigidly mounted on both sides and for the other connecting element to be mounted in an articulated manner on both sides, for instance, as shown in FIG. 1D. Another possibility is for one connecting element to be rigidly mounted on both sides and for the other connecting element to be rigidly mounted on one side and to be mounted in an articulated manner on one side. The concept of the invention likewise includes solutions in which one connecting element is mounted in an articulated manner on both sides and the other connecting element is rigidly mounted on one side and is mounted in an articulated manner on one side. Finally, it is also possible for both connecting elements to be mounted in an articulated manner on both sides, for instance, as shown in FIG. 1B.

In the sense of the invention, a rigid mounting is intended to be understood as meaning a connection which is capable of transmitting a torque, about a horizontal axis, between the connecting element and the holder arm or the fastening arm. In this case, a horizontal axis which is perpendicular to the longitudinal extent of an elongate connecting element is intended, in particular. In contrast, in the sense of this invention, an articulated mounting is not able to transmit such a torque, about a horizontal axis, from the connecting element to the holder arm or fastening arm or vice versa.

Particularly when both connecting elements are mounted in an articulated manner on both sides, it is advantageous to furthermore provide at least one spring element for generating a restoring force, for instance, as shown by spring element 8 in FIG. 1B. If both connecting elements are of the same length and are mounted in an articulated manner on both sides, the probe holder cannot be kept in a horizontal or approximately horizontal position on its own. Accordingly, it is necessary to generate a force that acts counter to the force of gravity. This is possible in a particularly cost-effective manner by fitting an additional spring element. For example, an elastic thread (for instance, as shown by spring element 8 in FIG. 1B), which is arranged such that it is not parallel to the connecting elements and in this manner generates a force that acts counter to the force of gravity, may be clamped between the holder arm and the fastening arm.

In order to achieve a compact design of the probe holder according to the invention, it may be advantageous for at least one connecting element to be in the form of a strip. It may also be advantageous for at least one connecting element to comprise a metallic material. If both of the above features are combined with one another, that is to say the connecting element is in the form of a strip and is produced from a metallic material, the connecting element may act like a spring leaf of a leaf spring. This is particularly favorable for the embodiments in which at least one connecting element is rigidly mounted at least on one side.

It goes without saying that the object of the invention is also achieved by means of a test apparatus for testing semiconductor components, said test apparatus having a probe holder of the type described above.

BRIEF DESCRIPTION OF THE DRAWING FIGURE

The invention will be explained in more detail below with reference to exemplary embodiments and associated drawings. In this case, FIG. 1A shows an inventive probe holder; FIG. 1B shows another inventive probe holder having connecting elements mounted in an articulated manner and having spring elements; FIG. 1C shows another inventive probe holder having connecting elements mounted in an articulated manner; and FIG. 1D shows a further inventive probe holder having connecting elements mounted in an articulated manner.

DETAILED DESCRIPTION

The probe holder illustrated in FIG. 1A comprises a holder arm 1, which has a needle holder in which a probe needle 2 is fastened, and a fastening arm 3 which is designed for fastening and for establishing electrical contact to a carrier device 4 and, in the exemplary embodiment, is also connected to the carrier device 4. The holder arm 1 and the fastening arm 3 are connected to one another by means of a parallel guide which, in the exemplary embodiment, comprises an upper connecting element 5 and a lower connecting element 6 which in FIG. 1A are both rigidly mounted on both sides, that is to say are connected to the holder arm 1 and the fastening arm 3 such that a torque can be transmitted about a horizontal axis. FIG. 1B shows another probe holder according to the invention having connecting elements 5,6 mounted in an articulated manner, for example, having both ends of members 5,6 mounted by hinges 7. According to one aspect of the invention, since members 5,6 in FIG. 1B are mounted in an articulated manner and at least one spring element 8, for example, an elastic thread, is arranged to generate forces that act counter to the force of gravity. FIG. 1C shows a another probe holder having connecting elements 5,6 mounted in an articulated manner, in this case, having the distal sides of members 5,6 mounted by hinges 7 to holder arm 1. FIG. 1D shows a further probe holder having connecting element 5 mounted in an articulated manner at both sides, and connecting element 6 rigidly mounted at both sides.

The connecting elements 5, 6 are in the form of strips and comprise a metallic material. They may therefore be used, in a particularly advantageous manner, as parts of conductor tracks which are routed from the location at which the fastening arm 3 is in contact with the carrier device 4 to the probe needle 2.

The invention claimed is:

1. A probe holder for a probe needle, said holder being adapted for fastening and electrical contact-connection on a carrier device of a test apparatus and said holder comprises a holder arm having a needle holder arranged at a free end of the holder arm to fasten the probe needle, and a fastening arm for connecting the probe holder to the carrier device, wherein the holder arm and the fastening arm are connected to one another by a parallel guide that minimizes rotation of the probe needle;

wherein the parallel guide comprises at least two elongated connecting elements which are arranged parallel to one another and at a distance from one another, and are each connected, at one end, to the holder arm, and, at another end, to the fastening arm; and wherein at least one connecting element is articulatedly connected at at least one end.

2. The probe holder as claimed in claim 1, wherein at least one connecting element is rigidly mounted at least on one end.

3. The probe holder as claimed in claim 1, further comprising at least one spring element for generating a restoring force at the parallel guide.

4. The probe holder as claimed in claim 1, wherein at least one connecting element is in the form of a strip.

5. The probe holder as claimed in claim 1, wherein at least one connecting element comprises a metallic material.

6. The probe holder as claimed in claim 1, wherein the parallel guide causes translatory movement of the holder arm and the probe needle without a rotary movement component as an external vertical force acts on the probe needle.

7. The probe holder as claimed in claim 1, wherein the parallel guide minimizes rotation of the probe needle about an axis of the holder arm.

8. The probe holder as claimed in claim 1, wherein the holder arm comprises an elongated element.

9. The probe holder as claimed in claim 8, wherein the holder arm comprises an elongated element having a length and a thickness.

10. The probe holder as claimed in claim 1, wherein the holder arm comprises an elongated element extending substantially parallel to the at least two elongated connecting elements.

11. The probe holder as claimed in claim 1, wherein the holder arm comprises a first end mounted to the parallel guide and a second, free end having the needle holder.

12. The probe holder as claimed in claim 1, wherein the holder arm and the needle are distinct structures.

13. The probe holder as claimed in claim 1, wherein the fastening arm, the parallel guide, and the holder arm each comprise elongated structures having a first end and a second end, and wherein the first end of the fastening arm is mounted to the carrier device, the first end of the parallel guide is mounted to the second end of the fastening arm, and the first end of the holder arm is mounted to the second end of the parallel guide.

14. The probe holder as claimed in claim 1, wherein articulatedly mounted comprises mounted in an articulated manner.

15. The probe holder as claimed in claim 1, wherein the parallel guide minimizes rotation of the probe needle about a horizontal axis perpendicular to an axis of the holder arm.

* * * * *